United States Patent
Kyrolainen et al.

(10) Patent No.: US 10,684,318 B1
(45) Date of Patent: Jun. 16, 2020

(54) SYSTEM AND METHOD FOR TESTING ANALOG BEAMFORMING DEVICE

(71) Applicant: Keysight Technologies, Inc., Santa Rosa, CA (US)

(72) Inventors: Jukka Kyrolainen, Oulu (FI); Pekka Kyosti, Oulu (FI); Ville Tuomo Petteri Heino, Oulu (FI); Jonne Piisila, Kempele (FI)

(73) Assignee: Keysight Technologies, Inc., Santa Rosa, CA (US)

( * ) Notice: Subject to any disclaimer, the term of this patent is extended or adjusted under 35 U.S.C. 154(b) by 26 days.

(21) Appl. No.: 16/175,034

(22) Filed: Oct. 30, 2018

(51) Int. Cl.
　　*G01R 29/10*　　(2006.01)
　　*H04B 17/00*　　(2015.01)
　　*G01R 29/08*　　(2006.01)
　　*H04B 7/0426*　　(2017.01)
　　(Continued)

(52) U.S. Cl.
　　CPC ....... *G01R 29/105* (2013.01); *G01R 29/0821* (2013.01); *H04B 7/043* (2013.01); *H04B 17/318* (2015.01); *H04B 17/3912* (2015.01)

(58) Field of Classification Search
　　CPC ...... G01N 21/55; G01R 1/06; G01R 29/0821; G01R 29/105; G06K 2009/3291; G06K 9/00771; G06K 9/00785; G06K 9/481; G06K 9/623; G06T 2207/10016; G06T 2207/20081; G06T 2207/30236; G06T 2207/30252; G06T 7/246; H04B 7/043; H04B 1/10; H04B 17/00; H04B 17/0087
　　See application file for complete search history.

(56) References Cited

U.S. PATENT DOCUMENTS

| 8,331,869 | B2 * | 12/2012 | Foegelle | ............ | H04B 17/0082 |
| | | | | | 455/115.2 |
| 8,805,290 | B2 * | 8/2014 | Guo | ................... | H04B 17/0087 |
| | | | | | 455/67.11 |

(Continued)

OTHER PUBLICATIONS

Qualcomm Incorporated, "Test methodology for mmWave Demod testing", 3GPP TSG-RAN5 WG5 5G-NR Adhoc Meeting #1 R5-180008, Munich, Germany, Jan. 16-Jan. 19, 2018, pp. 1-3.

(Continued)

*Primary Examiner* — Tho G Phan (57) ABSTRACT

A system provides OTA testing of a DUT having a DUT antenna array for forming physical beams. The system includes dual-polarized probes or probe groups, an anechoic chamber, a wireless channel emulator, and a test instrument. The dual-polarized probes or probe groups receive the physical beams formed by the DUT antenna array. The anechoic chamber houses the DUT antenna array and the probes or probe groups. The wireless channel emulator is coupled to the probes or probe groups for receiving the physical beams, and generates a calibrated OTA channel model having simulated beams corresponding to the physical beams. The calibrated OTA channel model simultaneously provides isolated wireless cable connections corresponding to the simulated beams, and emulates fading channel conditions. The test instrument, coupled to the wireless channel emulator, establishes a communications link with the DUT and evaluates performance characteristics of the DUT based on the calibrated OTA channel model.

18 Claims, 5 Drawing Sheets

(51) Int. Cl.
*H04B 17/391* (2015.01)
*H04B 17/318* (2015.01)

(56) References Cited

U.S. PATENT DOCUMENTS

| | | | | |
|---|---|---|---|---|
| 9,024,828 B2* | 5/2015 | Reed | ............... | G01R 29/10 |
| | | | | 343/703 |
| 9,407,381 B2 | 8/2016 | Kyosti et al. | | |
| 9,488,685 B2* | 11/2016 | Kyosti | ............... | H01Q 3/24 |
| 10,033,473 B1* | 7/2018 | Kyrolainen | ............... | H04B 17/391 |
| 10,110,326 B1 | 10/2018 | Kyrolainen et al. | | |
| 10,177,862 B2* | 1/2019 | Wen | ............... | H04B 17/0087 |
| 10,505,275 B2* | 12/2019 | Lee | ............... | H04B 17/0085 |
| 2016/0112080 A1 | 4/2016 | Gori | | |

OTHER PUBLICATIONS

Co-pending U.S. Appl. No. 15/844,044, filed Dec. 15, 2017.

* cited by examiner

SYSTEM AND METHOD FOR TESTING ANALOG BEAMFORMING DEVICE

BACKGROUND

Antenna arrays are increasingly used in electronic communications, including in the aerospace defense industry and the wireless telecommunications industry, for example. Antenna array test and calibration solutions are used to measure parameters of the antenna arrays (which may be referred to as characterizing the antenna arrays). Conventional solutions for test and calibration depend primarily on a vector network analyzer, which requires the device under test (DUT) including the antenna array module, or module under test (MUT), to have radio frequency (RF) connectors, such as coaxial connectors, in order to perform the test and calibration. However, with the evolution of wireless communication technologies, antenna arrays with direct connections to (i.e., integrated with) radio frequency (RF) transceivers of DUTs, and having no RF connectors, are becoming increasingly common. Overall performance of such a DUT presently must be tested "over-the-air," since there is no place to connect a coaxial cable from the DUT and/or the antenna array to test equipment. In fact, due to antenna array integration, overall DUT performance must now be tested as a function of the antenna array configuration. When the antenna array is designed to produce signal beams, for instance, then the DUT performance must be characterized over a range of beam angles and/or widths.

Conventional solutions for over-the-air (OTA) testing are aimed primarily at single antenna measurements. However, with the advent of millimeter wave (mmW) bands and corresponding wireless communication standards, such as IEEE 802.11ad, as well as the advent of 5G networks, cost, size and speed become key attributes of test methodology. To characterize performance, various attributes of the DUT, such as radiation profile, effective isotropic radiated power, total radiated power, error-vector-magnitude (EVM) of the modulation, and adjacent channel leakage ratios (ACLRs), for example, are characterized as a function of beam angle. Currently, this involves a very time-consuming process. For example, characterizing just the radiation profiles of a DUT as a function of beam angle may take hours.

Antenna characterization processes typically take place either at an outdoor test range or in an anechoic chamber. Outdoor test ranges are used for antennas having a very long far-field (e.g., greater than 5 m), rendering use of an indoor test range or anechoic chamber impractical. Anechoic chambers are shielded, including walls covered in absorbing material that minimizes internal reflections, typically by several tens of decibels.

There are a number of basic conventional techniques for antenna characterization using an anechoic chamber, such as a simple-far-field measurement technique for an antenna having a far-field that occurs at a sufficiently short distance that it can be measured directly in a chamber of practical size, and a near-field measurement technique, according to which near-field measurements are mathematically transformed to the far-field. Another conventional technique uses a compact antenna test range (CATR), where an approximately uniform source (a single antenna) illuminates a curved mirror where the resulting reflection is collimated. In this way, the DUT with a long far-field distance may be positioned in the collimated beam, and the DUT antenna's radiation pattern may be determined as the received power changes as a function of rotation angle (elevation and azimuth) of the DUT. The collimated reflection from the curved mirror allows the DUT to be characterized in the far-field in a more compact chamber than would otherwise be possible without the curved mirror.

As mentioned above, mmWave bands are being used in 5G networks in order to obtain wide enough bandwidth to enable high throughput. The high frequency bands tend to have high path loss, which generally requires use of antenna arrays to achieve higher antenna gain to offset the effects of the high path loss. Phased arrays (referred to herein as "phased antenna arrays" or simply "antenna arrays") are commonly used in devices for these high frequency bands, including both user equipment (UE) and base stations, such as eNodeBs/gNodeBs. In order to make the beamforming (BF) process efficient for antenna arrays, hybrid beamforming may be implemented. According to hybrid beamforming, techniques used in analog as well as digital beamforming are combined.

5G systems at higher frequencies (mmWave) apply integrated analog beamforming with a fast dynamic beam switching procedure, which may be tested OTA when RF-antenna connectors at each antenna element are not available. Both base station and user equipment (UE) may apply analog beamforming Each antenna port is connected to multiple antenna elements, and analog beamforming is applied for testing at each antenna port using a fixed set of element weighting coefficients, such that different beams may be chosen per orthogonal frequency division multiplexing (OFDM) symbol basis.

The effect of the analog beamforming (or other time-variant or time-invariant beamforming) may be simulated in conductive emulation by embedding correct antenna array radiation pattern (beam pattern) into the channel model at each time instant, as described, for example, by Kyosti et al., U.S. Pat. No. 9,407,381 (Aug. 2, 2016), which is hereby incorporated by reference in its entirety. According to the 3GPP standard, a 5G base station may have at maximum of 64 different fixed analog beam directions per antenna port for initial access beam sweeping. Beam sweeping may be performed by periodically transmitting synchronization and reference signals by different analog beams on a broadcast channel (BCH) for initial access and beam management purposes. During the beam sweeping on the BCH, the beams are changed in blocks of four OFDM symbols, referred to as synchronization signal (SS) blocks. Each beam may be defined by a fixed set of antenna element weighting coefficients.

During OTA testing, the DUT is placed into an anechoic chamber and the other link end (e.g., a communication tester or an UE emulator) may be connected to a channel emulator through cables or OTA. The beamforming procedure may be included in the testing using actual DUT antenna array and beamforming procedures if all clusters of a channel model ("isotropic channel") are included in the OTA channel model. The beamforming antenna array with directive narrow beams filters out effectively weak multipath clusters of the channel model. This means that the number of significant clusters is reduced compared to non-directive antenna systems, for example. The number of possible beams at the transmitter and/or the receiver of the DUT may be large, but the number of significant beam pairs may be much lower and many weak beams may be neglected in testing.

However, many aspects in the testing of 5G mmWave devices are related to testing of operation and performance of beam selection and tracking procedures. Thus, multiple beams are required for adequate testing. For example, beam management testing may involve beam switching, which requires at least two beams. Implementation of an OTA isotropic channel model requires inclusion of all clusters of a channel model into an OTA model. This means that the required number of probes (and channels in a channel emulator) in the anechoic chamber depends on the number of spatially separable clusters and rays in the channel model. Generally, clusters are components of a geometry-based stochastic channel model (GSCM) that represent propagation pathways of a multipath channel model. Each cluster consists of a number of rays (propagation paths). In a GSCM model, each cluster is defined to have certain angle of arrival, angle of departure, delay and power, as well as arrival and departure angle spreads. These parameters may be referred to as small scale channel model parameters. The rays of a GSCM model are generated for each cluster according to cluster angles and ray angle offsets determined according to cluster angle spreads. In accordance with current 3GPP model specifications, there are 20 rays per cluster. A fading model is implemented by a so-called sum-of-sinusoids method, in which each ray represents a sinusoid with an arrival angle specific Doppler phasor and the rays are summed to obtain a fading "tap" for each cluster.

A narrow beam device may pick clusters and rays of the channel model with high resolution, i.e., the device accurately samples the power angular spectrum (PAS) of the channel model. Therefore, the number of required probes in the isotropic channel model is very high for narrow beam devices.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

DETAILED DESCRIPTION

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree to one of ordinary skill in the art. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

According to various embodiments, a method and a system are provided that associate probes of a DUT with certain beams in order to make the number of probes dependent on the number of beams included in testing, as opposed to being dependent on the number of clusters and/or rays and the PAS of the channel model. The OTA testing of a beamforming DUT may be performed in the near-field using a simplified chamber with fewer probes, as compared to conventional testing techniques. Also, the various embodiments enable inclusion of a given number of beams in the testing to enable beam management testing use cases.

The number of probes and emulator channels needed for OTA testing in an anechoic chamber is less than that of conventional techniques. Also, beam specific probe placement and channel modeling are used instead of isotropic PAS dependent probe placement. The embodiments do not require synchronous time variant calibration matrix measurement and execution. Also, the embodiments enable implementation of a specific channel model for multiple DUT beams in the anechoic chamber, and at least one embodiment uses simple multi-beam wireless cable to enable testing of beam management by including multiple beams, as opposed to single beam demodulation testing. The embodiments also employ spatial OTA modelling to implement a spatial correlation function within a test zone of the anechoic chamber. The test zone is the area or volume in the anechoic chamber where spatial correlation and other channel model characteristics may be controlled with acceptable accuracy. The antennas (e.g., antenna array) of the DUT (at mmWave) and/or the entire DUT (at sub 6 GHz) must fit within the test zone. Achievable test zone size may depend, in part, on probe density. The embodiments also enable simplification of the other link end OTA model by embedding only the limited number of beams in the channel model.

Each of the various embodiments includes at least three stages: channel model generation for simulated beams, DUT beam alignment in an anechoic chamber, and channel model calibration. The number of beam directions that may be included in testing is equal to the number of dual-polarized probes (or probe groups comprising multiple dual-polarized probes) in the anechoic chamber. Each dual-polarized probe includes two probes having vertical and horizontal polarizations, respectively. Within a probe group, the dual-polarized probes may spaced apart by about 1-3 degrees, for example.

Only one dual-polarized probe per beam is required when there is no need to control spatial correlation over spatially separated DUT sub-arrays with the same beam direction, i.e., no more than two multiple-input and multiple-output (MIMO) transmission layers. In the case of two MIMO transmission layers, it may be assumed that the MIMO transmission is performed over two orthogonally polarized antennas, and therefore spatial dimension of the channel model is not relevant in demodulation testing. Spatial dimension is relevant in testing beam management procedures in this case, but spatial correlation is not. When spatial correlation over multiple sub-arrays is required (i.e., more than two layers), a probe group including at least two dual-polarized probes per beam direction is sufficient to control the spatial correlation within the test zone. In this case, the range length for small devices may be from about 0.15 m to about 0.4 m, 0.5 m or 1.0 m, for example, depending on the size of the DUT. For mmWaves, it is sufficient to cover an area slightly larger than the DUT antenna arrays. The range length is the distance between the dual-polarized probes and the DUT in the center of the testzone.

When the DUT has an array antenna with multiple sub-arrays, each probe group can be associated with one beam per sub-array, where the sub-array beams have the same directions and where the sub-array beams of the multiple sub-arrays, respectively, have the same channel model small scale parameters. When the sub-arrays point in different directions and the sub-array beams in each of the sub-arrays have different directions, each of the sub-arrays requires an individual probe group. However, the number of required probe groups may be coupled to the number of supported beam directions. Also, the beam channel model small scale parameters are different for the different sub-arrays.

The probe groups should be spatially separated apart from one another in the anechoic chamber, such that a beam pointed to one of the probe groups has low gain (e.g., about −10 dB to about −15 dB) towards the other probe groups. For purposes of illustration, it is assumed that the antenna array of the DUT (e.g., a base station) has a narrow beam width, and the method is applied in a cable connection setup, where one link end (e.g., the base station) may be in an anechoic chamber, and the other link end (e.g., the user equipment) may have a cable connection. Alternatively, in a two chamber setup, both link ends (e.g., the base station and the user equipment) are in respective anechoic chambers. In the two chamber setup, both the base station and the user equipment may be considered the DUT.

Embodiments discussed herein include (i) beam space OTA testing of the DUT without synchronization signal block (SSB) gain control and with calibration, (ii) beam space OTA testing of the DUT with SSB gain control, and (iii) multi-beam wireless cable testing of the DUT with SSB gain control and transfer matrix calibration. Generally, a SSB includes a primary synchronization signal, a secondary synchronization signal, and data, as discussed below. A beam may be referred to a synchronization signal (SS) beam when it is configured to be used for SSB transmissions, e.g., in accordance with predetermined weighting coefficient vectors that generate a fixed number of SS beams. That is, the DUT may be assumed to have a codebook of weighting coefficient vectors for generating a fixed number of beams to be used, e.g., for transmission of different SSBs, as well as a codebook for transmission of channel state information—reference symbol (CSI-RS), or other reference signals or physical channels. Generally, a codebook simply refers to a fixed set of weighting coefficients to generate a fixed set of beam directions. Different DUTs have different codebooks (e.g., which may be provided by the DUT manufacturer). Alternatively, such codebook information may be approximated by measuring the beam directions. SSB indices may range at maximum from 0 to 63, and each of the 64 SSBs may be transmitted on a different SS beam. Thus, the DUT transmits the SSBs in the anechoic chamber through the DUT physical beams, which are received by and the dual-polarized probes.

For purposes of illustration, in the embodiments involving OTA testing, the DUT is assumed to be a base station. However, OTA testing may likewise be performed on UE (as the DUT) when reference signal received power (RSRP) measurements of the UE beams are possible. The OTA testing method with SSB gain control is typically not suitable for the UE, although the method may be exploited in dual-chamber setups to measure and align beam powers of the UE. For example, when the DUT is UE, one SSB may be sent from the base station in an anechoic chamber via one SS beam through one probe group to the UE in another anechoic chamber, and other SSBs may be set silent for a sufficiently long time period (e.g., at least about 40 ms) to enable the UE to acquire its best receive-beam for the one SSB and to report the corresponding synchronization signal-RSRP (SS-RSRP). The SS-RSRP may be used as a measurement in calibration of UE beam alignment. The SSB from the base station is transmitted to UE via the (physical) gNB SSB beam pointed towards one of the probes/probe groups in the anechoic chamber containing the base station and one of the UE (physical) beams pointed towards one of the probes/probe groups in the anechoic chamber containing the UE.

Figure 1:
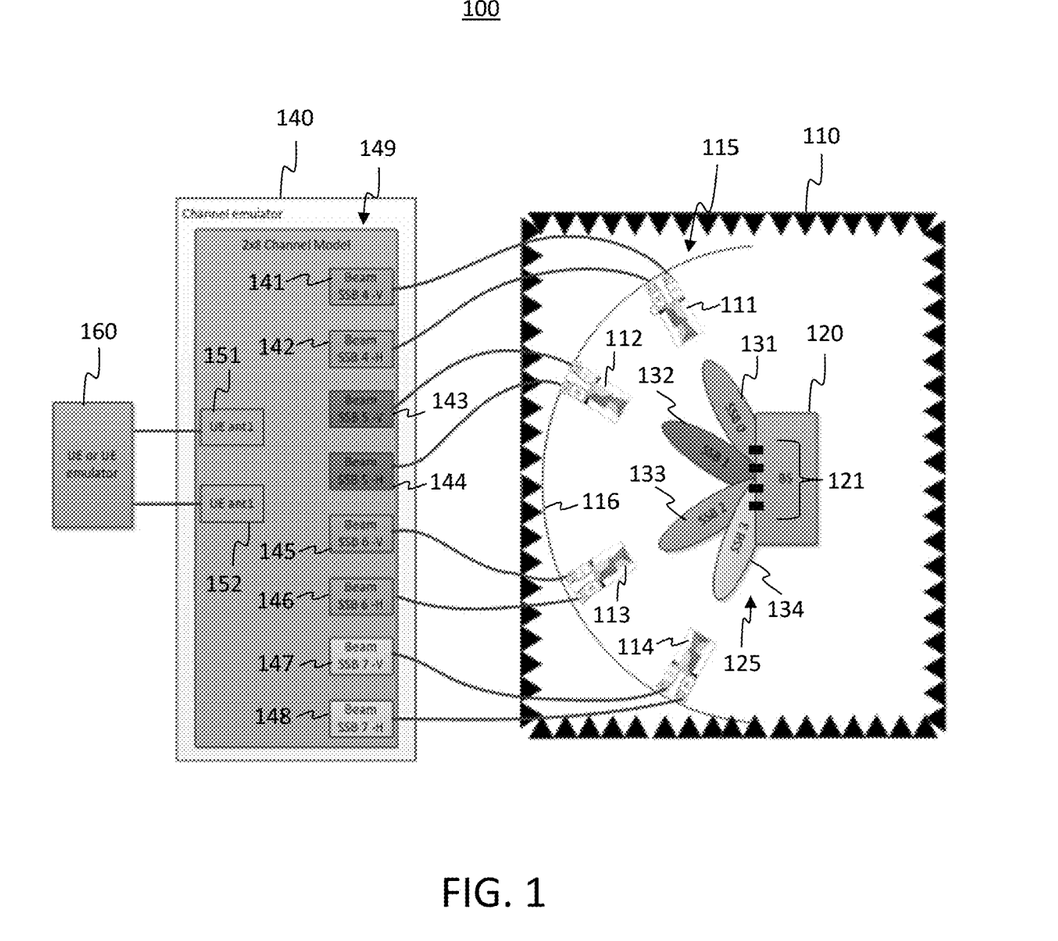
FIG. 1 is a simplified block diagram of a test system for performing over-the-air (OTA) testing of a DUT having an antenna array within an anechoic chamber, according to representative embodiments.

FIG. 1 is a simplified block diagram of a test system for performing OTA testing of a DUT having an antenna array within an anechoic chamber, according to representative embodiments.

Referring to FIG. 1, test system 100 includes an anechoic chamber 110 containing a DUT 120, a channel emulator 140, and a test instrument 160. The test instrument 160 may be a UE or base station emulator, implemented using various types of test instrumentation, such as a vector signal analyzer, or an actual end device, such as a UE when the DUT 120 is a base station, or a base station (e.g., an LTE base station or 5G base station) when the DUT 120 is a UE. The term test instrument (end device) 160 is intended to cover both emulator and actual implementations, as well as UEs and base stations, unless otherwise noted. In the depicted embodiment, the test instrument 160 is connected by a cable connection, for example. In alternative embodiments, the test instrument 160 may be in another anechoic chamber, as mentioned above.

For purposes of illustration, the DUT 120 is a base station having a beamforming circuit, including an antenna array 125, for transmitting RF signals (e.g., to a UE). In alternative configurations, the DUT 120 may be a base station receiving and/or transmitting RF signals (e.g., from/to a UE) or a UE transmitting and/or receiving RF signals (e.g., to/from a base station), without departing from the scope of the present teachings. In the depicted embodiment, the antenna array 125 includes illustrative sub-array 121, which is shown transmitting DUT physical beams 131, 132, 133 and 134 in different directions corresponding to probe groups of a probe array antenna 115, discussed below. The beams 131, 132, 133 and 134 represent the most significant or strongest (highest power) beams in each of the corresponding directions, although it is understood that there may be multiple, less significant beams in each of the directions, as well. It is further understood that the antenna array 125 may include more than one sub-array, without departing from the scope of the present teachings. The sub-array 121 may include an 8×8 array of antenna elements (or 64 antenna elements), for example. In an embodiment including a total of four 8×8 sub-arrays, for example, the antenna array 125 of the DUT 120 would have a total of 256 antenna elements. Also, there would be four sets of overlapping beams.

For purposes of illustration, it may be assumed that each of the beams 131, 132, 133 and 134 include SSB transmissions. The SSBs (e.g., with SSB indices 0, . . . , 63) may be transmitted from the sub-array 121 in an SS burst set (e.g., over a 20 ms period), and possibly from another sub-array in another burst set when the antenna array 125 includes additional sub-arrays. The sub-array 121 may perform beam sweeping, for example.

The anechoic chamber 110 houses a probe array antenna 115 that includes multiple probe groups, each of which includes at least two dual-polarized probes, as discussed above. The two probes having vertical and horizontal polarizations within each of the dual-polarized probes of the probe groups may be separated from one another by about 1-3 degrees, for example. In the depicted embodiment, the probe array antenna 115 includes four probe groups: first probe group 111 including at least first dual-polarized probes 111A and 111B, second probe group 112 including at least second dual-polarized probes 112A and 112B, third probe group 113 including at least third dual-polarized probes 113A and 113B, and fourth probe group 114 including at least fourth dual-polarized probes 114A and 114B. Use of dual-polarized probes in each of the probe groups enables highly accurate near field measurements. For purposes of illustration, the first to fourth probe groups 111 to 114 are configured to receive beams 131, 132, 133 and 134, respectively, from the sub-array 121. Of course, the probe array antenna 115 may have fewer or more than four probe groups and/or more than one dual-polarized probe per probe group, without departing from the scope of the present teachings. Also, the probe array antenna 115 may comprise probe groups having single probes (as opposed to dual-polarized probes) and/or may have probes or dual-polarized probes without probe groups, without departing from the scope of the present teachings.

The first to fourth probe groups 111 to 114 are arranged on a substantially parabolic shaped support 116 in the anechoic chamber 110. The support 116 is located at a distance from the antenna array 125 sufficient to control spatial correlation within the test zone, which may be determined from the power angular spectrum (PAS) of the channel model. For example, the distance between the first to fourth probe groups 111 to 114 and the sub-array 121 may be about 0.5 m to about 1 m, for example. The distance may depend on the size of the antenna array 125.

For purposes of illustration, the selected SSB indices corresponding to the beams 131, 132, 133 and 134 of the DUT 120 in the anechoic chamber 110 may be set to 0, 1, 2 and 3, and the SSB beam indices of simulated OTA channel model 149 implemented by the channel emulator 140 may be set to 4, 5, 6 and 7. The selected SSB indices in the anechoic chamber 110 are the SSB beam indices of the beams 131 to 134 pointing towards the first to fourth probe groups 111 to 114, and are chosen based on probe directions. The simulated beams, which are calculated in the OTA channel model 149, have SSB beam indices chosen based on cluster directions and powers with respect to simulated beam model embedded in the OTA channel model 149. That is, the SSB indices of beams 131 to 134 depend on the probe directions with respect to the codebook of beam directions, whereas the simulated beams embedded in the OTA channel model 149 depend on the cluster direction and powers with respect to the codebook of beam directions. The codebook of beam directions refers to a fixed set of weighting coefficients for generating a fixed set of beam directions. Beam index or beam direction may be considered as an entry in the codebook, for example, a vector of weighting coefficients is defined for each beam index and each beam index represents one beam direction.

The simulated beams in the OTA channel model 149 do not have to represent the same SSB indices/beam directions as those of the beams 131 to 134. The simulated beams that have the strongest power with given channel model parameters are selected in the OTA channel model 149. The same codebook is used for SSB indices of the physical and simulated beams. Generally, the purpose of the OTA channel model 149 is to reproduce a best possible approximation of a "reference channel model" with the available probes (first to fourth probe groups 111 to 114) in the anechoic chamber 110.

In the depicted example, connectivity of the test instrument 160 to the channel emulator 140 is shown as a simple cabled two-antenna port connection simulating a first UE antenna 151 and a second UE antenna 152, although other types of connectivity to the test instrument 160, such as wireless cable, RTS or multi-probe anechoic chamber (MPAC) OTA, may be implemented, without departing from the scope of the present teachings. In the depicted embodiment, the channel model 149 is a 2×8 channel model, which includes two channels for the first and second UE antennas 151 and 153, discussed above, and eight channels for the vertical and horizontal polarizations of the first to fourth probe groups 111 to 114, respectively. The eight channel model includes channels 141 and 142 for receiving vertically and horizontally polarized beams from the first probe group 111 (SSB beam index 4), channels 143 and 144 for receiving vertically and horizontally polarized beams from the second probe group 112 (SSB beam index 5), channels 145 and 146 for receiving vertically and horizontally polarized beams from the third probe group 113 (SSB beam index 6), and channels 147 and 148 for receiving vertically and horizontally polarized beams from the fourth probe group 114 (SSB beam index 7). When the test instrument 160 is a UE with four dual polarized probes in beam space in another anechoic chamber, for example, similar to the DUT 120 (which is a base station in this example), the OTA channel model 149 would be 8×8. In this case, 64 beam pairs in total would be supported in the channel emulator 140. It is not likely that any of the beam pairs out of the 64 supported would carry meaningful power contribution for purposes of beam management or other performance testing of the devices.

Figure 2A:
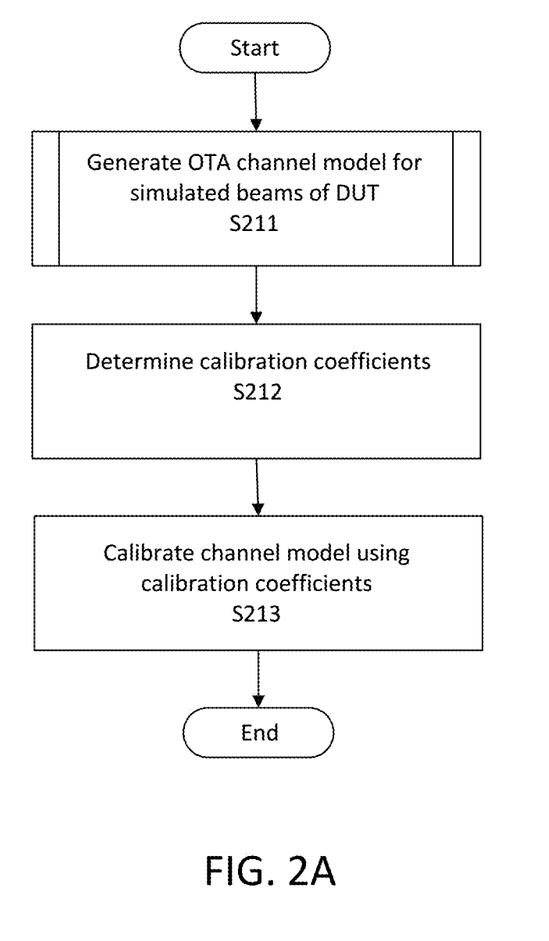
FIG. 2A is a flow diagram showing testing of a DUT, including beam space OTA measurements without synchronization signal block (SSB) gain control and with calibration, according to a representative embodiment.
Figure 2B:
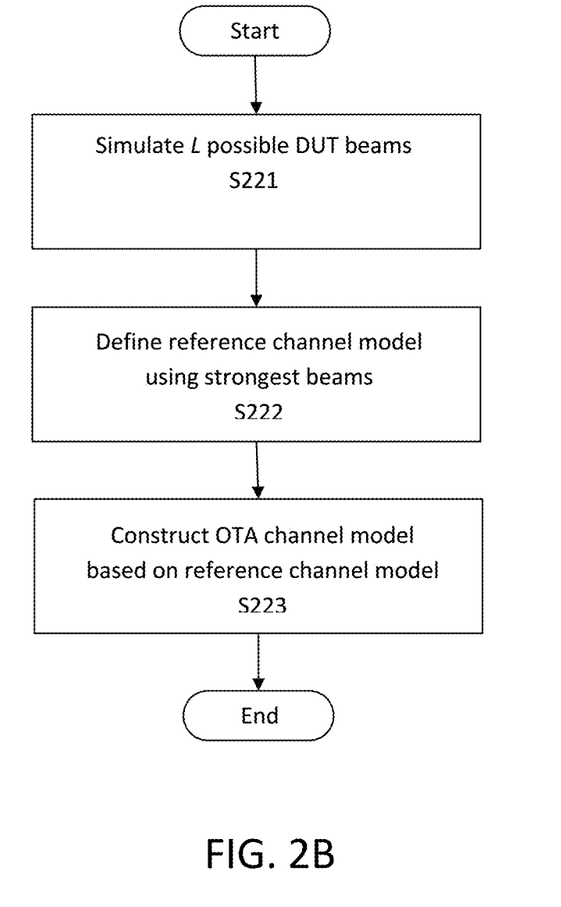
FIG. 2B is a flow diagram showing a process for generating an OTA channel model in the DUT testing method of FIG. 2A, according to a representative embodiment.

FIG. 2A is a flow diagram showing testing of a DUT, including beam space OTA measurements without SSB gain control and calibration, according to a representative embodiment. FIG. 2B is a flow diagram showing a process fro generating an OTA channel model in the DUT testing method of FIG. 2A, according to a representative embodiment.

Referring to FIG. 2A, in block S211, the OTA channel model 149 is generated for simulated beams of the DUT 120 (e.g., corresponding to beams 131, 132, 133 and 134) according to an illustrative process shown in FIG. 2B. Referring to FIG. 2B, all L possible DUT beams of the DUT 120 are simulated in block S221 to provide a full reference channel model. For example, channel model time domain fading coefficients for L DUT beams are defined according to Equation (1), as well as how the simulated beams are to be included in the OTA channel model 149. Ideally, L is equal to the number of beams in the DUT codebook, although as a practical matter, the exact number and directions of the beams of the DUT 120 may not be known. The simulated DUT beams in the OTA channel model 149 may be defined according to some reference beam configuration model, for example, according to 3GPP specifications. In some cases, having the detailed information, L in the full reference channel model may be equal to possible beam directions of the DUT beams, although not necessarily.

In block S222, a reference channel model is defined using the strongest (highest power) beams, referred to as the most significant beams S, from among the L DUT beams of a full reference channel model. That is, the powers of all simulated beams are calculated, and the strongest simulated beams are selected for the reference channel model. A cable connection (or an OTA connection), for example, to the channel emulator 140 at the other link-end (e.g., test instrument 160) is applied.

As discussed above, the reference channel model may be simulated according to Equation (1), where $H_l(t)$ represents the full reference channel model time domain fading coefficients for each simulated beam l, where l=1, ..., L, where L is the total number of possible beams in the full reference channel model simulation, discussed above:

$$H_l(t) = \sum_{n=1}^{N} \sum_{m=1}^{M} G_l(\Omega_{n,m}) A_{n,m}(t) [1 \ 1]^T \quad (1)$$

Referring to Equation (1), N is the number of clusters, M is the number of rays per cluster, $G_l$ is an approximated 1×2 complex beam pattern matrix of the lth beam of the DUT 120 to direction $\Omega_{n,m}$ of the $m^{th}$ ray of the $n^{th}$ cluster, and $A_{n,m}(t)$ is a 2×2 time variant propagation matrix. The propagation matrices $A_{n,m}(t)$ and the directions of the rays are channel model parameters.

There are S most significant beams (SS beams) of the DUT 120, where S may equal the number of probe groups in the anechoic chamber 110. In a special case, the number of applicable probe groups may be limited if isolation between some of the probe groups is not satisfactory. In this case the number of SS beams will be limited according to the number of useful probe groups. The most significant beam is typically the strongest (highest power) beam from each probe group that provides the highest receive-power when embedded into the full reference channel model, although other factors may be considered. That is, the most significant beam is the strongest beam that provides the highest receive-power in the full reference channel model. S most significant beams are the S strongest beams in the full reference channel model. The S most significant beams of the DUT 120 may be selected to include in the reference channel model, for example, by calculating time averages $\langle |H_l(t)|^2 \rangle$ and picking indices l of the s' highest values of the most significant beams to compose set s'∈S.

If the other link-end (e.g., test instrument 160, which may be a UE, a UE emulator, or a communication tester) is beam space OTA, all beam pairs may be simulated according to Equation (2):

$$H_{l,l'}(t) = \sum_{n=1}^{N} \sum_{m=1}^{M} G_l(\Omega_{n,m}) A_{n,m}(t) G'_{l'}(\Omega'_{n,m})^T \quad (2)$$

That is, Equation (1) is used for beam power simulation/beam selection when the other link end is cabled, and Equation (2) is for beam power simulation/beam selection when beam space OTA is at both link ends. Referring to Equation (2), $G'_{l'}$ is an approximated 1×2 complex beam pattern matrix of the $l'^{th}$ beam of the test instrument 160 (non-DUT) to direction $\Omega'_{n,m}$. Again, S most significant beams are chosen, i.e., pairs l, l' (having all DUT beams l different) to compose the set s'∈S to be included in Equation (1) and/or Equation (2). This step is used only to determine the set S of strongest beams (beam pairs) to be emulated.

Next, after Equation (1) or Equation (2), depending on configuration, the OTA channel model 149 is constructed from the reference channel model in block S223. Generating the OTA channel model 149 includes mapping the reference channel model to the first to fourth probe groups 111 to 114. The reference channel model may be run directly in the channel emulator 140 by mapping outputs to the correct first to fourth probe groups 111 to 114, or to individual dual-polarized probes. Generally, generation of the OTA channel model 149 involves generation of independent fading coefficients per probe within each of the first to fourth probe groups 111 to 114 and finding probe weighting coefficients that minimize spatial correlation error within the test zone (e.g., at least an area of full array with all sub-arrays, which may be referred to as full device size).

With regard to constructing the OTA channel model 149, a channel coefficient matrix H(t) is generated, where $H(t) \in \mathbb{C}^{S \times Q}$ for the selected S beams (beam pairs) from the DUT 120 corresponding to the S most significant beams, where the beam radiation patterns of the S beams are embedded into the reference channel model, further defining the reference channel model. The channel coefficient matrix H(t) is of size S×Q, where Q is the number of probes or connectors at the end device 160 depending on the connectivity method of the link end. S is equal to the available first to fourth probe groups 111 to 114 in the anechoic chamber 110.

Each beam s'∈ set $\mathcal{S}$ has a beam specific channel model, i.e., row of the channel coefficient matrix H(t), and will be assigned to one of the first to fourth probe groups 111 to 114 in the anechoic chamber 110, e.g., mapping the reference channel model to provide the OTA channel model 149. Generally, the purpose of the beam specific channel model in the reference channel model is to mimic the real physical beams of the DUT 120.

In the case of a single sub-array, such as the sub-array 121 in the embodiment depicted in FIG. 1, the simulated beams of the reference channel model are directly mapped to the first to fourth probe groups 111 to 114, and therefore the OTA channel model 149 is the same as the reference channel model. Also, in the case of the single sub-array, the simulated beams would be mapped to one probe per probe group. Thus, the OTA channel model 149 in FIG. 1 may also be considered the reference channel model as a special case. However, also in this case, a certain beam may be mapped to a certain probe group 111 to 114 depending on isolation between the probe groups 111 to 114. The strongest beam of the reference channel model would be mapped to the probe group with the best isolation after calibration, discussed below. Further, the calibration of the anechoic chamber 110 (e.g., probe group imbalances based on SS-RSRP measurements, discussed below) may be applied in the OTA channel model 149 that is run in the channel emulator 140.

In case of multiple DUT sub-arrays, one DUT direction will be modelled by one reference channel model for each of the sub-arrays with the same beam direction (i.e., one reference channel model per beam direction). In other words, the mapping to the OTA channel model 149 is done such that a channel model of one of the sub-arrays is used as a reference channel model, and probe specific uncorrelated fading sequences and probe weighting within each probe group is applied to create the spatial correlation function of the reference channel model within the test zone (e.g., the area of all the sub-arrays). This distinguishes over conventional wireless cable and MPAC techniques. However, the spatial correlation between the sub-arrays in the anechoic chamber 110 is generated by weighting of the dual dual-polarized probes within the first to fourth probe groups 111 to 114 such that the desired spatial correlation function at the test zone is achieved. The reference channel model may be considered a full matrix, and a model of one beam direction may be one entry (e.g., one input, multiple outputs) of that matrix. The OTA channel model 149 is calculated based on the reference channel model.

When probe groups are used, as in the depicted embodiment, as opposed to individual probes, a single beam fading model per probe group may be applied as the reference channel model to create the OTA channel model 149. Generally, the purpose of the probe groups is to control spatial correlation over different DUT sub-arrays with the same physical beam direction. It may be assumed that the PAS of the OTA channel model 149, seen by the sub-arrays having the same beam direction, is the same when far-field assumption and similarity of the beam patterns holds in the scenario of the OTA channel model 149. Also, when probe groups are used, probe specific channel coefficients and probe weighting within each probe group are generated based on single beam s channel model (or beam filtered clusters), such that the spatial correlation function at the test zone is realized according to the PAS of the single beam s' entry in the reference channel model.

Optionally, it may be assumed that a dominant cluster is between two simulated beams in the reference channel model. The strongest cluster of the reference channel model is a dominant cluster when it is substantially stronger than the second strongest cluster. When simulated beams have a common dominant cluster, it is expected that the fading sequence is highly correlated. Therefore, it may be determined whether the correlation is high, e.g. >0.8, and if so, the two strongest beams are mapped to the same probe group and new beams are chosen for each available probe, i.e., the number of simulated beams in the channel emulator 140 is S+1. Beam patterns in simulation and channel model generation may be based on a standard array model selected from among known standard array models with the desired beam width. Alternatively, the beam patterns in simulation and channel model generation may measured as a preliminary step (e.g., prior to block S211).

Finally, the simulated beams s' are coupled with the DUT physical beams $s_k$ within the anechoic chamber 110. This may be accomplished by routing beam specific channel models (rows) of the channel coefficient matrix H(t) to probe groups k, one row per probe group, which changes the OTA channel model 149. In case of multiple sub-arrays and probe groups, there is also the OTA channel model creation within each probe group (uncorrelated fading sequences and probe weighting), discussed above.

In summary, the OTA channel model 149 may be generated by simulating all DUT beams to provide simulated beams, select the strongest/most relevant beams from among the simulated beams, and define the reference channel model based on the selected simulated beams. The simulated beams are an approximation of the DUT beams in the anechoic chamber 110. In an embodiment, a generic reference antenna model may be used to determine the simulated beams. The OTA channel model 149 is then constructed by mapping the reference channel model to the probe groups. The reference channel model may be run directly in channel emulator 140 as the OTA channel model 149 by mapping outputs of the channel emulator 140 to the correct probes. In the case of probe groups, a new OTA channel model is calculated based on the reference channel model, as discussed above.

Referring again to FIG. 2A, once the OTA channel model 149 is generated for the simulated beams of the DUT 120, calibration coefficients are determined in block S212. The calibration coefficients may be determined by the SS-RSRP measurements during a beam alignment process, for example. The calibration coefficients are $1/P_{s_k}$, and may be obtained according to the beam alignment, that is, the calibration coefficients may be measured for the aligned beams.

In order to map the beams of the reference channel model to the probe groups, the physical beams of the DUT 120 are aligned in the anechoic chamber 110. To align the DUT physical beams, beam powers $P_{l,k}$ (e.g., SS-RSRP) are measured for all DUT physical beams at each of the probe groups k in the anechoic chamber 110. This may be done by measuring the beam power at each probe in each probe group, or by measuring the power at one probe of each probe group to approximate the power for that probe group. For the sake of simplifying explanation, it is assumed that one probe per probe group is measured, so that k is the number of probe groups. The strongest DUT beam index s is chosen for each probe group (e.g., first to fourth probe groups 111 to 114). Notably, the DUT beam index s is not related to the channel model beam index s', discussed above. Thus, each probe group k=1, . . . , S has a dedicated beam index $s_k$ of the DUT physical beam and a power $P_k$ corresponding to the beam index $s_k$. For multiple sub-arrays with the same beam directions, one beam index $s_k$ per sub-array may be selected for each of the probe groups, in which case the beam index s represents a beam direction index. Different sub-arrays transmit SS beams (physical beams used for SSB transmission) sequentially in different SS beam burst set periods. Thus, the sub-arrays can be easily distinguished during the SS-RSRP measurement. If similarity of the beam directions does not hold, one beam index per probe may be selected, and different sub-arrays require different probes.

During the SS-RSRP measurement, the DUT 120 may be rotated or moved, and the probes groups may be switched and/or moved, to obtain best possible isolation (maximize isolation) between the strongest DUT physical beam and the second strongest DUT physical beam of a sub-array at each probe group. In other words, these adjustments may be performed to achieve max $$\frac{P_{s_k}}{P_{z,k}}$$

over all probe groups k, where $P_{z,k}$ denotes the second highest power after the selected beam power $P_{s_k}$ among $P_{l,k}$.

Optionally, when the two strongest simulated beams of a sub-array have a common cluster, a correct beam power ratio may be found at the common probe group for the two strongest DUT physical beams. Then $$\frac{P_{s_k}}{P_{z,k}}$$

may be maximized by rotating and/or moving the DUT and/or switching and/or moving the probe groups.

Once the beam alignment is complete, the calibration coefficients for the aligned beams are measured. The calibration coefficients may be measured, for example, as $1/P_{s_k}$ for the aligned DUT physical beams $s_k$.

In block S213, the OTA channel model 149 is calibrated by applying the calibration coefficients determined in block S212. Calibrating the OTA channel model 149 includes adjusting the channel model gain corresponding to each DUT physical beam $s_k$ in order to compensate for imbalances between different beam-probe group pair SS-RSRPs in the anechoic chamber 110. Adjusting the channel model gain of a DUT physical beam $s_k$ includes scaling the output power at an output port of the channel emulator 140 to/from group probe k with a factor proportional to $1/P_{s_k}$. Relative beam gain differences are based on the OTA channel model 149 simulation. In an alternative embodiment, power calibration is not performed in order to include DUT physical beam power differences in the testing, although this requires an accurate beam alignment, according to the beam alignment procedure discussed above with reference to procedure in block S223 to avoid errors due to misalignment. Power calibration is the same as OTA channel model calibration, excluding channel transfer function calibration.

As discussed above, after the beam alignment, each probe group is expected to have one strong SS beam from the DUT 120 in the anechoic chamber 110. Each of the probe groups is associated with a selected SS beam specific channel model, thus the channel emulation can be executed for the S strong SS beams (selected SS beams) from the DUT 120 through the S beam specific channel models. The other (non-selected) SS beams, i.e., excluding the set of S selected SS beams, will also transmit some power through the probe groups in the anechoic chamber 110. However, since the non-selected SS beams do not have corresponding channel models, they are represented by the beam specific channel models and/or combinations of the channel models of the selected SS beams. Thus, the beam specific channel models of the non-selected SS beams are not correctly modelled according to the beam pattern. However, it may be assumed that the attenuation of the non-selected SS beams compared to the selected SS beams can be on the order of 5-10 dB greater than the attenuation of the selected SS beams, for example, depending on factors such as the OTA channel model 149 and embedded beam specific channel models.

The realized gains of the non-selected SS beams depend on the beam alignment, i.e., the respective gain of the non-selected SS beams toward the probe group. The effect on test results of the non-selected SS beams is small or negligible, and thus it may be determined that further calibration need not be performed, depending on requirements. However, as discussed below with reference to FIG. 3, the effects of the non-selected SS beams may be removed by synchronous SSB gain control.

Another source of error includes coupling of a selected SS beam to probe groups that are assigned to other SS beams, referred to as cross-probe coupling. Isolation between a selected probe group assigned to the selected SS beam and the other probe groups not assigned to the selected SS beam depends on the locations of the probe groups and DUT beam pattern characteristics. It may be assumed that 10-15 dB isolation may be achieved with DUTs that transmit narrow beams.

An alternative technique for calibrating the OTA channel model 149 is transfer matrix calibration. It is assumed that isolation due to beam alignment performed pursuant to block S212 of FIG. 2A is sufficient to avoid complex transfer function calibration. That is, the effect of the cross-probe coupling may be calibrated out using the transfer matrix calibration in the multi-beam wireless cable with synchronous SSB gain control and calibration, discussed below with reference to FIG. 4.

In the various embodiments herein, the calibrated OTA channel model 149 may be used for testing the DUT and/or DUT antenna array in order to characterize (determine parameters of) the same. Thus, the calibrated OTA channel model 149 may be used to perform quality control on the DUT, as well as other DUTs of the same type, and regression testing, for example. The calibrated OTA channel model 149 may also be used to perform early phase research and development testing, e.g., where the DUT parameters can be adjusted based on the test results. Various attributes of the DUT, such as MIMO throughput performance and functionality of beam selection and beam tracking procedures in fading channel conditions, may also be characterized.

Figure 3:
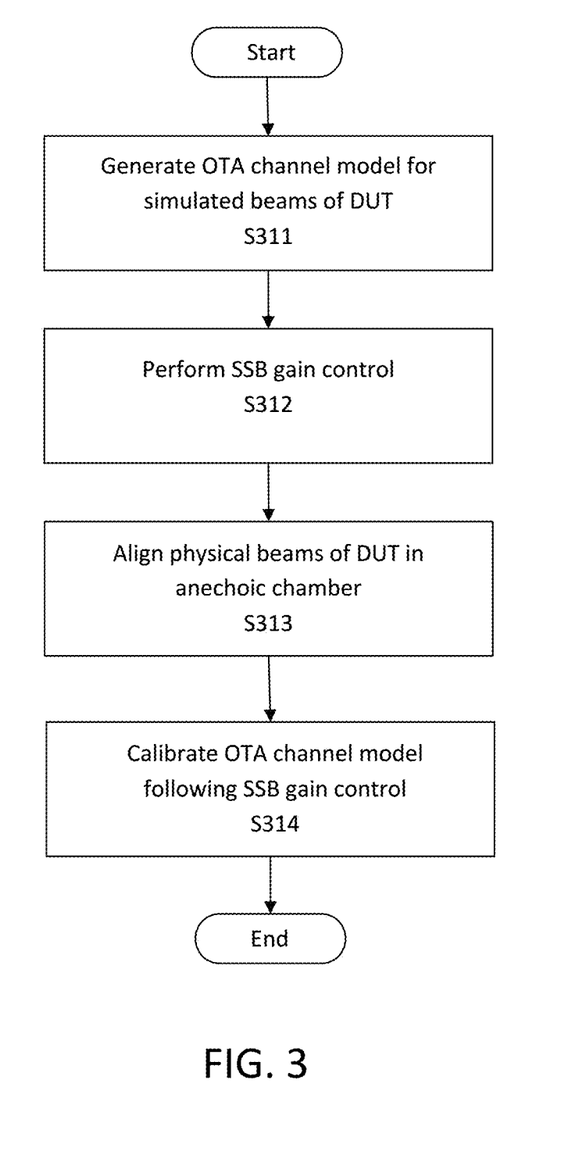
FIG. 3 is a flow diagram showing testing of a DUT, including beam space OTA measurements with SSB gain control and calibration, according to a representative embodiment.

FIG. 3 is a flow diagram showing testing of a DUT, including beam space OTA measurements with SSB gain control and calibration, according to a representative embodiment.

Referring to FIG. 3, in block S311, the OTA channel model 149 is generated for simulated beams of the DUT 120 (e.g., for beams 131, 132, 133 and 134), including generation of a channel coefficient matrix H(t). The process indicated by block S311 is substantially the same as that indicated by block S211 in FIG. 2, and therefore will not be repeated here.

In block S312, SSB gain control is performed with regard to the channel coefficient matrix H(t). SSB gain control further reduces the possibility of the non-selected beams ($\notin S$) being used by the DUT 120 for user data transmission. When considering downlink and neglecting noise, a model of the test system 100 may be provided according to Equation (3):

$$Y(t)=F(t)X(t) \tag{3}$$

Referring to Equation (3), X(t) is the transmitted signal vector for signals transmitted by the DUT 120, Y(t) is the received signal vector of signal received by the test instrument 160, and F(t) is the transfer matrix composed of the anechoic chamber 110, the setup of the first to fourth probe groups 111 to 114, and the channel coefficients of the channel coefficient matrix H(t) run within the channel emulator 140.

In case of a setup with two anechoic chambers (e.g., where the test instrument 160 is also in an anechoic chamber), the transfer matrix F(t) is composed of transfer functions $F_1(t)$ and $F_2(t)$ of the first and second anechoic chambers, respectively, and the channel emulator 140, according to Equation (4):

$$F(t)=F_1(t)H(t)F_2(t) \quad (4)$$

Therefore, the signal transmitted by the DUT 120 contains periodic SS beam transmissions including SSBs in X(t), for example, in 3GPP (5G New Radio (NR)). In order to prevent measurement of the non-selected SS beams to be measured during the process, the channel coefficients H(t) within the channel emulator 140 can be set to zero for the duration of SSB transmission of the non-selected SS beam. That is, H(t)=0 at time instants $t \in T_{SSB}$, where t corresponds to the periodic transmissions of SSBs of the non-selected SS beams. When the SSBs are not carried through the channel emulator 140, the test instrument 160 receiving the signal vector Y(t) at the other link-end will report low signal level back through the uplink, so the DUT 120 does not use these non-selected beams for any user data transmission.

Block S312 requires synchronous channel emulation with control on SSB gains in OTA channel model 149. Notably, SSB transmissions are periodic with known cycle and timing. Therefore, the synchronous channel emulation does not to be fully protocol aware. In an embodiment, the SSBs are 4 symbol blocks, which means that block duration in 5G NR mmWave would be either 18 μs (240 kHz SCS) or 35.6 μs (120 kHz SCS).

In block S313, the physical beams of the DUT 120 are aligned in the anechoic chamber 110. As discussed above, to align the DUT physical beams, beam powers $P_{l,k}$ (e.g., SS-RSRP) are measured for all actual beams at each of the probe groups k in the anechoic chamber 110. The strongest DUT beam index s is chosen for each probe group. Notably, the DUT beam index s is not related to the beam specific channel model beam index s', discussed above. Thus, each probe group k=1, . . . , S has a dedicated beam index $s_k$ of the actual beam and a power $P_k$ corresponding to the beam index $s_k$. For multiple sub-arrays with the same beam directions, one beam index $s_k$ per sub-array may be selected for each of the probes, in which case the beam index s represents a beam direction index. Different sub-arrays transmit SS beams with SSBs sequentially in different SS beam burst set periods, thus the sub-arrays can be easily distinguished during the SS-RSRP measurement. If similarity of the beam directions does not hold, one beam index per probe group may be selected, and different sub-arrays require different probe groups.

During the SS-RSRP measurement, rotation or movement of the DUT 120 and/or the probes groups may be performed in the context of beam alignment, as discussed above with reference to block S212 in FIG. 2A, for example, although the metric or target of adjustment is different. That is, it is assumed that the impact of the non-selected beams can be diminished by the SSB gain control, discussed above. Thus, the adjustment aims at minimizing cross-probe coupling between the selected SS beams, e.g., to maximize isolation of all probe groups assigned to beams other than each selected SS beam.

Accordingly, measured power levels $P_{l,k}$ are used to choose the best probe group/beam combination. More particularly, each combination of probe group k and DUT physical beam $s_k$ is found such that the power $P_{s_k,k}$ is maximized and the cross talk from the selected probe group k to all other beams is minimized.

An additional constraint involves minimum power level A for the pairs of probe groups and selected SS beams is set according to Equation (5):

$$(s_k, k) = \arg_{s_k \in S, k \in 1, \ldots, S} \quad (5)$$
$$\left( \left( \max \frac{P_{s_k,k}}{P_{l,k}} \forall l \neq s_k, l = 1, \ldots, L, \forall s_k \in S \right) \wedge (P_{s_k,k} > A) \right)$$

Optimization is performed jointly across all beams because choices for each beam affect all other beams. In an embodiment, beam/probe group pairs may satisfy Relationship (6), where C is the minimum allowed cross talk ratio:

$$\begin{cases} P_{s_k,k} > A \\ \frac{P_{s_k,k}}{P_{l,k}} > C, \quad \forall l \neq s_k, l = 1, \ldots, L \end{cases} \quad (6)$$

Notably, if sufficient pairs of probe groups/beams satisfying Relationship (6) cannot be found for all DUT physical beams $s_k$, the environment within the anechoic chamber 110 may be altered. For example, the DUT 120 and/or the probe groups (e.g., first to fourth probe groups 111 to 114) may be displaced and/or rotated within the anechoic chamber 110, after which the beam alignment procedure of block S313 is re-started and repeated.

Optionally, a simplified method can be used if joint optimization is not applied. That is, the DUT 120 may be rotated or moved and/or the probe groups may be switched or moved during the SS-RSRP measurement to maximize isolation between each selected SS beam and all probe groups assigned to other selected SS beams. In other words, these mentioned adjustments may be performed to achieve max $$\frac{P_{s_k}}{P_{s_{k'}}|_{\forall k' \neq k}}$$

over all selected SS beams $s_k$.

In block S314, the OTA channel model 149, determined in part using SSB gain control, is further calibrated. As discussed above with reference to block S312, calibrating the OTA channel model 149 includes adjusting the channel model gain corresponding to each DUT physical beam $s_k$ in order to compensate for imbalances between different beam-probe group pair SS-RSRPs in the anechoic chamber 110. Adjusting the OTA channel model gain of a DUT physical beam $s_k$ includes scaling the output power of the channel emulator port connected to one of the probe groups associated with the DUT physical beam $s_k$ to/from group probe k with a factor proportional to $1/P_{s_k}$. Relative beam gain differences of the final calibrated emulation model realized for the DUT receiver are based on channel model simulation. In an alternative embodiment, power calibration, which is OTA channel model calibration excluding the channel transfer function calibration, is not performed in order to include DUT physical beam power differences in the testing, although this requires an accurate beam alignment in the anechoic chamber 110, provided according to the procedure in block S313 to avoid errors due to misalignment.

After the beam alignment, each probe group is expected to have one strong SS beam from the DUT 120 in the anechoic chamber 110. Each of the probe groups is associated with a selected SS beam specific channel model, thus the channel emulation can be executed for the S selected (strong) SS beams from the DUT 120 through the S beam specific channel models. The non-selected SS beams will also transmit some power through the probe groups in the anechoic chamber 110. However, the effects of the non-selected SS beams will have been substantially removed by nulling channel gains by the channel emulator 140 at particular time instants, in accordance with the SSB gain control, discussed above.

Figure 4:
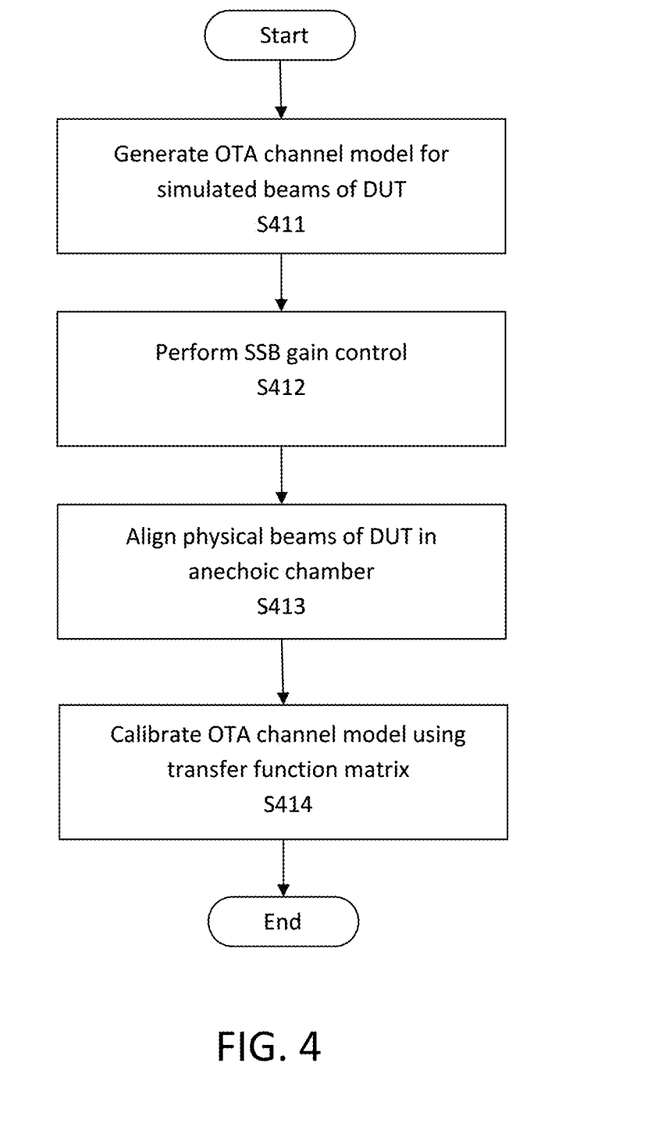
FIG. 4 is a flow diagram showing testing of a DUT, including beam space OTA measurements with synchronous SSB gain control and transfer function calibration, according to a representative embodiment.

FIG. 4 is a flow diagram showing testing of a DUT, including beam space OTA measurements with synchronous SSB gain control and transfer function calibration, according to a representative embodiment.

Referring to FIG. 4, in block S411, the OTA channel model 149 is generated for simulated beams of the DUT 120 (e.g., for beams 131, 132, 133 and 134), including generation of a channel coefficient matrix H(t). The process indicated by block S411 is substantially the same as that indicated by block S211 in FIG. 2, and therefore will not be repeated here.

In block S412, SSB gain control is performed with regard to the channel coefficient matrix H(t). SSB gain control further reduces the possibility of the non-selected beams ($\notin \mathcal{S}$) being used by the DUT 120 for user data transmission, where generally, the channel coefficients H(t) (or specific rows of the matrix) within the channel emulator 140 are set to zero for the duration of SSB transmission of the non-selected SS beams. Performance of the SSB gain control process indicated by block S412 is substantially the same as that indicated by block S312 in FIG. 3, and therefore will not be repeated here.

In block S413, the physical beams of the DUT 120 are aligned in the anechoic chamber 110. Performance of the beam alignment process indicated by block S413 is substantially the same as that indicated by block S313 in FIG. 3, and therefore will not be repeated here.

In block S414, the OTA channel model 149, determined in part using SSB gain control, is further calibrated using a transfer function. Calibrating the OTA channel model 149 includes adjusting the channel model gain corresponding to each DUT physical beam $s_k$ in order to compensate for imbalances between different beam-probe group pair SS-RSRPs in the anechoic chamber 110. That is, generating the calibrated OTA channel model may include constructing a transfer function matrix of responses between probe groups and selected DUT physical beams, respectively. In the present embodiment, adjusting the channel model gain of a DUT physical beam $s_k$ includes measuring and constructing a transfer function matrix G of gains, where $G \in \mathbb{R}^{S \times S}$ or of complex gains, where $G \in \mathbb{C}^{S \times S}$ to all selected SS beams $s \in \mathcal{S}$ and from all probes k=1, . . . , S. Notably, in the case of probe groups the number of columns of G is >S.

Interference from other probes is calibrated out by multiplying the channel coefficient matrix H(t) by the inverse of the measured transfer function matrix $G^{-1}$, such that $H'(t)=G^{-1}H(t)$. In the case of probe groups, the calibrated channel coefficient matrix for the channel emulator 140 is obtained by multiplying from the left with the pseudo inverse of the gain matrix, i.e., $H'(t)=(G^H G)^{-1} G^H H(t)$. Multiple probes of a probe group may be used as independent elements to construct orthogonal channels for the sub-arrays of the DUT 120 with same beam direction. It may be beneficial to have a shorter distance compared to other beam space OTA methods to enable separation of the beams of the different sub-arrays.

Multi-beam wireless cable enables full and accurate control of any channel model for the selected SS beams. The multi-beam wireless cable is simplified over conventional beam wireless cable systems and methods. For example, conventional wireless cable for multi-beam (beam sweeping) devices assumes fully protocol aware modelling, where beam calibration coefficients are to be changed over time according to beams. In particular, conventional wireless cable aims at constructing the wireless cables for the antenna ports of a DUT. A multi-beam device that performs beam sweeping has time variant beams on each antenna port, and so a conventional wireless cable method would need to update calibration coefficients for each beam state, which requires full protocol awareness or control interface from the DUT to determine the beam state at each time instant. In comparison, according to the various embodiments herein, full protocol awareness is not required (only synchronization to SSB transmissions is required to enable SSB gain control in the channel emulator 140), and time variant calibration coefficients are not required because the wireless cables of the selected beams are on all the time, instead of having just one wireless cable per sub-array that is changed per beam.

The channel emulator 140, as well as the methods shown in FIGS. 2, 3 and 4, may be implemented using one or more processors, such as a computer processor, application specific integrated circuits (ASICs), field-programmable gate arrays (FPGAs), or combinations thereof, using software, firmware, hard-wired logic circuits, or combinations thereof. A computer processor, in particular, may be constructed of any combination of hardware, firmware or software architectures, and may include its own memory (e.g., nonvolatile memory) for storing executable software/firmware executable code that allows it to perform the various functions. In an embodiment, the computer processor may comprise a central processing unit (CPU), for example, executing an operating system.

A memory (not shown) may be further provided in order to store software and/or programs executable by the processor, as well as data, such as measurement data, collected from the DUT 120, the probe array antenna 115, the test instrument 160, as well as other sources of information. The memory may be implemented by any number, type and combination of random access memory (RAM) and read-only memory (ROM), for example, and may store various types of information, such as computer programs and software algorithms executable by the one or more processors (and/or other components), as well as raw data and/or testing and measurement data storage, for example. The various types of ROM and RAM may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are tangible and non-transitory storage media (e.g., as compared to transitory propagating signals).

The various components, structures, parameters and methods are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A system for performing over-the-air (OTA) testing of a device under test (DUT) having a DUT antenna array for providing a plurality of DUT physical beams, the system comprising:
a plurality of dual-polarized probes or probe groups for receiving the plurality of DUT physical beams of the DUT antenna array;
an anechoic chamber housing at least the DUT antenna array and the plurality of dual-polarized probes or probe groups;
a wireless channel emulator coupled to the plurality of dual-polarized probes or probe groups for receiving the plurality of DUT physical beams from the plurality of dual-polarized probes or probe groups, and generating a calibrated OTA channel model comprising a plurality of simulated beams corresponding to DUT physical beams, respectively, wherein the calibrated OTA channel model simultaneously provides isolated wireless cable connections for emulating the plurality of simulated beams, respectively, and fading channel conditions; and
a test instrument coupled to the wireless channel emulator, the test instrument establishing a communications link with the DUT and evaluating at least one performance characteristic of the DUT based on the calibrated OTA channel model.

2. The system of claim 1, wherein the DUT comprises a base station or a mobile user device.

3. The system of claim 1, wherein the test instrument comprises a mobile user device, a base station or a communication tester.

4. The system of claim 1, wherein the wireless channel emulator is programmed to:
generate an OTA channel model for the plurality of simulated beams;
determine calibration coefficients based at least in part on the plurality of DUT physical beams in the anechoic chamber; and
calibrate the OTA channel model to provide the calibrated OTA channel model using the calibration coefficients to compensate for imbalances between beam-probe pair powers in the anechoic chamber.

5. The system of claim 4, wherein generating the OTA channel model comprises:
simulating possible beams for the plurality of DUT physical beams of the DUT antenna array;
selecting most significant beams from among the possible beams, and simulating beams corresponding to the selected most significant beams to include in the OTA channel model; and
generating a channel coefficient matrix for the simulated beams corresponding to the selected most significant beams, wherein radiation patterns of the simulated beams are embedded into the OTA channel model,
wherein rows of the channel coefficient matrix comprise specific channel models for the simulated beams.

6. The system of claim 5, wherein determining the calibration coefficients comprises aligning the plurality of DUT physical beams in the anechoic chamber so that each dual-polarized probe of the plurality of dual-polarized probes or probe groups has one strong beam isolated from other beams, and the one strong beam is coupled with a simulated beam in the OTA channel model.

7. The system of claim 6, wherein aligning the plurality of DUT physical beams comprises:
measuring beam powers of all of the DUT physical beams for each of the dual-polarized probes or probe groups;
selecting a strongest measured beam power for each of the dual-polarized probes or probe groups; and
associating the simulated beams with the DUT physical beams corresponding to the selected strongest measured beam powers.

8. The system of claim 7, wherein measuring the DUT physical beam powers comprises measuring synchronization signal (SS)—reference signal received powers (RSRPs) of the beams.

9. The system of claim 8, wherein calibrating the OTA channel model comprises:
for each of the DUT physical beams corresponding to the selected strongest measured beam powers, adjusting channel model gain of the associated simulated beams to compensate for the imbalances between different beam-probe pair SS-RSRPs in the anechoic chamber, each of the imbalances comprising a difference between actual strongest measured SS-RSRP of one DUT physical beam of one dual-polarized probe or probe group and actual strongest measured SS-RSRP of another DUT physical beam of another dual-polarized probe or probe groups.

10. The system of claim 1, wherein the DUT antenna array includes a plurality of sub-arrays, each dual-polarized probe or probe groups being associated with one beam per sub-array for receiving the plurality of DUT physical beams.

11. A method for performing over-the-air (OTA) testing of a device under test (DUT), having a DUT antenna array for forming a plurality of DUT physical beams, in an anechoic chamber using a plurality of probes or probe groups for receiving the plurality of DUT physical beams formed by the DUT antenna array, the method comprising:
receiving the plurality of DUT physical beams from the plurality of probes or probe groups; and
generating a calibrated OTA channel model comprising a plurality of simulated beams corresponding to the plurality of DUT physical beams, respectively, wherein the calibrated OTA channel model simultaneously provides isolated wireless cable connections corresponding to the plurality of simulated beams, respectively, and emulates fading channel conditions.

12. The method of claim 11, wherein generating the calibrated OTA channel model comprises:
generating an OTA channel model for the plurality of simulated beams of the DUT;
determining calibration coefficients using synchronization signal (SS)—reference signal received power (RSRP) measurements of the plurality of DUT physical beams following beam alignment; and
calibrating the OTA channel model by applying the determined calibration coefficients to compensate for imbalances between beam-probe pair RSRPs in the anechoic chamber.

13. The method of claim 12, wherein calibrating the OTA channel model comprises adjusting a channel model gain corresponding to each DUT physical beam of the plurality of DUT physical beams to compensate for imbalances between SS-RSRPs corresponding to pairs of DUT physical beams and probes or probe groups in the anechoic chamber.

14. The method of claim 12, wherein the beam alignment comprises:
measuring beam power for each of the DUT physical beams at each of the probe groups in the anechoic chamber, and determining a DUT beam index for each of the DUT physical beams based on the measured beam power and a beam direction;

selecting a strongest DUT beam index for each probe group; and rotating the DUT and/or switching the probe groups to maximize isolation between the strongest DUT beam index and a second strongest DUT beam index at each probe group.

15. The method of claim 11, further comprising:

evaluating at least one performance characteristic of the DUT at a test instrument based on the calibrated OTA channel model.

16. The method of claim 11, further comprising:

generating an OTA channel model for the plurality of simulated beams corresponding to the plurality of physical beams of the DUT; and performing SSB gain control to remove effects of non-selected DUT physical beams during the OTA channel model emulation.

17. The method of claim 16, wherein generating the calibrated OTA channel model comprises constructing a transfer function matrix of responses between the probes or probe groups and selected DUT physical beams, respectively, and calibrating out cross-probe interference by multiplying a channel coefficient matrix of the OTA channel model by an inverse of the transfer function matrix.

18. The method of claim 11, wherein generating the calibrated OTA channel model comprises generating independent fading coefficients per probe within each probe group, and determining probe weighting coefficients that minimize spatial correlation error within a test zone in the anechoic chamber.

* * * * *